(12) United States Patent
Naughton et al.

(10) Patent No.: US 7,141,503 B2
(45) Date of Patent: Nov. 28, 2006

(54) METHODS FOR MANUFACTURING A SOFT ERROR AND DEFECT RESISTANT PRE-METAL DIELECTRIC LAYER

(75) Inventors: John Naughton, Idaho Falls, ID (US); Mark M. Nelson, Pocatello, ID (US)

(73) Assignee: AMI Semiconductor, Inc, Pocatello, ID (US)

( * ) Notice: Subject to any disclaimer, the term of this patent is extended or adjusted under 35 U.S.C. 154(b) by 210 days.

(21) Appl. No.: 10/877,482

(22) Filed: Jun. 25, 2004

(65) Prior Publication Data

US 2005/0287782 A1    Dec. 29, 2005

(51) Int. Cl.
*H01L 21/302* (2006.01)

(52) U.S. Cl. .............. 438/692; 438/687; 438/690; 438/691; 438/695; 257/E21.494; 257/E21.271

(58) Field of Classification Search ............... 438/692, 438/687, 690, 691, 695
See application file for complete search history.

(56) References Cited

U.S. PATENT DOCUMENTS

| | | | |
|---|---|---|---|
| 5,514,616 A | 5/1996 | Rostoker et al. | 437/57 |
| 5,554,555 A | 9/1996 | Rostoker et al. | 437/52 |
| 5,663,086 A | 9/1997 | Rostoker et al. | 438/210 |
| 6,426,285 B1 | 7/2002 | Chen et al. | 438/624 |
| 6,511,923 B1 | 1/2003 | Wang et al. | 438/783 |
| 6,617,690 B1 | 9/2003 | Gates et al. | 257/758 |
| 2003/0228764 A1* | 12/2003 | Khan et al. | 438/692 |
| 2004/0119145 A1* | 6/2004 | Sun et al. | 257/632 |
| 2006/0079090 A1* | 4/2006 | Elers et al. | 438/685 |

* cited by examiner

*Primary Examiner*—Asok K. Sarkar
*Assistant Examiner*—Victor V. Yevsikov
(74) *Attorney, Agent, or Firm*—Workman Nydegger

(57) ABSTRACT

A method for forming a pre-metallization layer on an underlying micro-structure, and a corresponding micro-structure formed by the method. The micro-structure may be a semiconductor circuit and/or a Micro-Electro-Mechanical Systems (MEMS) device. A first layer of undoped silicate glass is deposited on a micro-structure. Then, a layer of phospho silicate glass is deposited on the first layer of undoped silicate glass. This combination is then densified by applying a temperature to the combination that is sufficient to densify the layer of phospho-silicate glass, while being below the glass flow temperature. After densification, a second layer of undoped silicate glass is deposited on the densified layer of phospho silicate glass. Finally, the upper surface of the second layer of undoped silicate glass is polished using a chemical mechanical polishing process. The result is a dielectric layer of high density and low stress, and that reduces soft errors and defects.

36 Claims, 4 Drawing Sheets

METHODS FOR MANUFACTURING A SOFT ERROR AND DEFECT RESISTANT PRE-METAL DIELECTRIC LAYER

BACKGROUND OF THE INVENTION

1. The Field of the Invention

The present invention relates generally to micro-structure manufacturing technology. More specifically, the present invention relates to a method and mechanism for manufacturing a pre-metal dielectric layer that is resistant to soft errors and defects.

2. Background and Relevant Art

Manufactured micro-structures are playing an ever more important role in the advancement of civilization. Such micro-structures may include, for example, semiconductor circuits, which are present in almost every device or system that implements some form of electronic logic or function. Micro-structures may also include Micro-Electro-Mechanical Systems (MEMS) devices. Such MEMS devices may include, for example, microscopic devices that accomplish some function using electrical and mechanical principles. General examples of conventional MEMS devices include micro-sensors, micro-motors, micro-gears, or the like. MEMS devices may be manufactured using semiconductor material or non-semiconductor materials.

In recent generations, feature dimension sizes have become smaller and smaller, both for semiconductor circuits and MEMS. Furthermore, the number of metallization layers in a typical semiconductor circuit has increased in order to provide as much circuitry per unit area of die space. In order to selectively isolate the various metallization layers, a dielectric material is typically formed between the metallization layers, with conductive vias formed at the points where connections are desired. In addition, proper selective isolation from the underlying substrate (e.g., a semiconductor wafer) is achieved by fabricating a pre-metallization dielectric layer over the wafer prior to fabricating any metallization layers. Once again, appropriate conductive vias are formed to provide appropriate electrical connections with the underlying substrate.

In order to promote structural integrity and thus reduced defects in the fabricated micro-structure, it is important that each layer be manufactured upon a smooth and flat surface. Accordingly, after manufacturing each dielectric layer (both the pre-metallization dielectric layer and any inter-metallization dielectric layers) it is important to planarize the surface of the dielectric layer prior to forming other structures on top of that surface.

Chemical Mechanical Polishing (CMP) technology combines chemical and mechanical effects to polish the surface of a dielectric layer to be relatively smooth. However, even with such CMP technology, scratching of the dielectric layer surface may occur, thereby introducing non-flat features onto the top surface of the dielectric layer. Such scratches may significantly increase the defects in the finished micro-structure.

One cause of scratching is from the intrinsic stress of the dielectric material. If the dielectric material has intrinsic tensile stress, the dielectric surface will have some concavity, with the level of concavity being dependent on the magnitude of the tensile stress. Similarly, if the dielectric material has intrinsic compressive stress, the dielectric surface will have some convexity, with the level of convexity being dependent on the magnitude of the compressive stress. Such concavity or convexity in the top surface of the dielectric layer means that the more elevated portions of the top surface are more roughly engaged with the CMP polishing pad than other portions of the top surface. This causes the elevated portions to be more susceptible to scratching.

Some dielectric materials use dopants such as boron in order to reduce the flow temperature of the dielectric material. Thus, lower temperatures may be applied to the wafer and allow gravity to flatten the top surface of the dielectric material, to thereby avoid the CMP process. It is desirable to lower the flow temperature since higher temperatures can cause unwanted diffusion to occur thereby changing the electrical or mechanical characteristics of the micro-structure.

However, the use of boron dopants presents some reliability problems, especially for electronic circuitry. Specifically, boron easily decays. When boron$^{10}$ atoms are struck by photons having certain energy levels, the boron nucleus splits releasing a Lithium nucleus, an alpha particle, and a neutron. The occurrence of these particles can affect the electrical characteristics of any surrounding circuitry. Errors caused by this decay are called "soft errors". Boron dopant decay has been shown to be a source of soft errors in a variety of memories and logic circuitry.

Another important property of a dielectric material is that it be uniformly dense. This is because via holes are often etched through the dielectric material in order to later form conductive vias needed for electrical connections between metallization layers, or with the underlying substrate. However, the etch rate of the dielectric material is a strong function of the density of the material. Accordingly, uniform density of the dielectric material means that the via holes are relatively uniformly etched. This uniform density thereby reduces defects due to incomplete via holes causing an undesigned open circuit.

One conventional technology that achieves highly uniform density involves the use of BoroPhosphoSilicate Glass (BPSG) as the pre-metallization dielectric layer. With the application of heat in the range of from 800 degrees Celsius to 1000 degrees Celsius, the BPSG glass will flow to fill in gaps in the underlying structure with uniform density. Such temperatures do not cause significant adverse diffusion that could degrade the function of the structure. However, the use of BPSG glass has at least two disadvantages.

First, although the density is uniform, its density is also low, which makes the material susceptible to scratching. For example, FIG. 3 shows a cross sectional view of a BPSG pre-metallization dielectric layer with several fractures induced by scratches in its top surface. These scratches may also cause electrical failure. For example, FIG. 4 shows a top view of a BPSG pre-metallization dielectric layer with several dispersed tungsten vias. Between two of the vias, an arching micro-scratch has been inadvertently filled with tungsten, thereby causing an undesigned short between two of the vias. The reduction of scratching would improve the yield in fabrication of the micro-structure.

Second, the presence of the boron material in the BPSG dielectric material may cause the soft errors mentioned above, thereby adversely affecting the electrical performance of any surrounding circuitry.

More recently, High Density Plasma (HDP) Chemical Vapor Deposition (CVD) has been used to form the pre-metallization dielectric layer. This technology allows for the deposition of a dielectric material that fills gaps in the underlying structure, without applying heat, and without the use of dopants. Furthermore, the resulting dielectric material has increased film density, thereby improving its resistance to scratching. However, capital equipment needed to perform HDP CVD processes is expensive. Furthermore, this technology is relatively new, which translates to higher defectivity due the lack of technological maturity. In addition, the use of HDP as the deposition mechanism in active areas may cause plasma-induced damage to the surrounding structure.

Accordingly, what would be advantageous are methods and mechanisms for forming a pre-metallization layer of high density and lower stress, with reduced soft errors, at temperatures that would not cause significant adverse diffusion, and that do not rely on expensive and potentially damaging HDP CVD processes.

BRIEF SUMMARY OF THE INVENTION

The foregoing problems with the prior state of the art are overcome by the principles of the present invention, which relate to a method for forming a pre-metallization layer on an underlying micro-structure, and a corresponding micro-structure formed by the method. The micro-structure may be a semiconductor circuit and/or a Micro-Electro-Mechanical Systems (MEMS) device.

A first layer of undoped silicate glass is deposited on a micro-structure. Then, a layer of phospho silicate glass is deposited on the first layer of undoped silicate glass. This combination is then densified by applying a temperature to the combination that is sufficient to densify the layer of phospho-silicate glass, while being below a glass flow temperature of either of the undoped silicate glass or the phospho-silicate glass. After densification, a second layer of undoped silicate glass is deposited on the densified layer of phospho silicate glass. Finally, the upper surface of the second layer of undoped silicate glass is polished using a chemical mechanical polishing process.

The resulting structure has several advantages as compared to the prior art. First, by performing densification prior to depositing the second layer of undoped silicate glass, rather than after, the internal stress of the resulting dielectric layer is significantly reduced. Furthermore, the resulting dielectric layer is highly dense. Undoped silicate glass is highly dense due to the lack of dopant impurities. Furthermore, the phospho silicate glass is also densified. The combination of low stress and high density results in a dielectric layer that is highly resistant to scratching, thereby reducing defects.

Furthermore, the presence of phosphorous dopants in the phospho silicate glass promotes contamination gettering, thereby removing contaminants away from the electrically active portions of the micro-structure. The relative lack of boron as a dopant in this middle phospho silicate glass layer means that there are fewer soft error caused by boron decay in the dielectric layer. The result is improved electrical performance in surrounding circuitry.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above recited and other advantages and features of the invention can be obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate to a method for forming a pre-metallization layer on an underlying micro-structure, and a corresponding micro-structure formed by the method. The micro-structure may be a semiconductor circuit and/or a Micro-Electro-Mechanical Systems (MEMS) device. A first layer of undoped silicate glass is deposited on an underlying micro-structure. Then, a layer of phospho silicate glass is deposited on the first layer of undoped silicate glass. This combination is then densified by applying a temperature to the combination that is sufficient to densify the layer of phospho-silicate glass, while being below the glass flow temperature. After densification, a second layer of undoped silicate glass is deposited on the densified layer of phospho silicate glass. Finally, the upper surface of the second layer of undoped silicate glass is polished using a chemical mechanical polishing process. The result is a dielectric layer of high density and low stress, and that reduces soft errors and defects.

Figure 1:
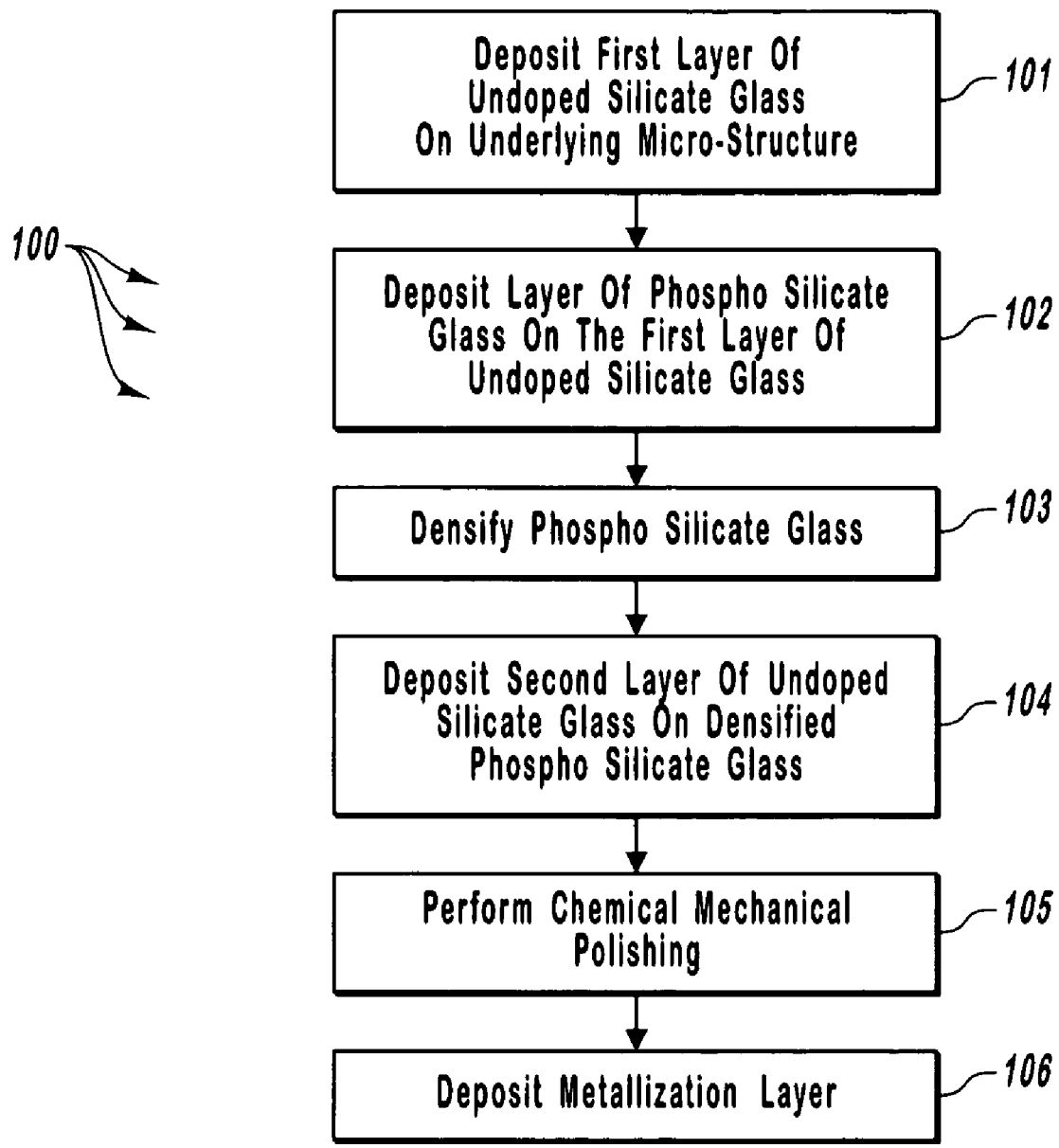
FIG. 1 is a flowchart of a method for forming a pre-metallization dielectric layer on an underlying micro-structure in accordance with the principles of the present invention.

FIG. 1 illustrates a flowchart of a method 100 for forming a pre-metallization dielectric layer on an underlying micro-structure in accordance with the principles of the present invention. FIG. 1 will be described in conjunction with FIGS. 2A through 2E, which shows a cross section of a micro-structure as the method 100 progresses.

Figure 2A:
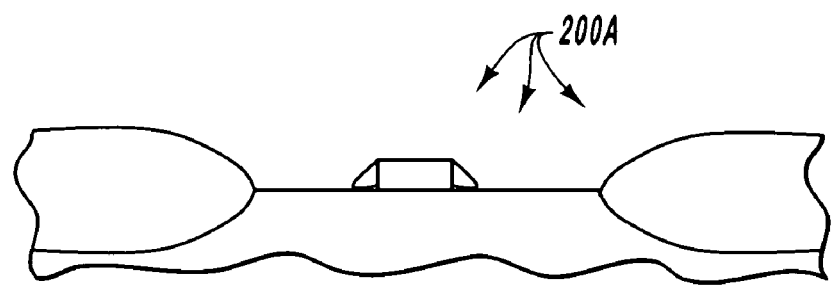
FIGS. 2A through 2E illustrate various developing stages of the fabrication process in accordance with the principles of the present invention.

FIG. 2A illustrates an underlying micro-structure 200A upon which a pre-metallization dielectric layer may be fabricated. The underlying micro-structure 200A is illustrated as being a specific micro-structure in the form of a Complementary Metal Oxide Semiconductor (CMOS) structure pre-fabricated using Local Oxidization of Silicon (LOCOS) or Shallow Trench Isolation (STI). However, the micro-structure may be any microstructure. For example, the micro-structure may be a portion of a semiconductor circuit, or a portion of a Micro-Electro-Mechanical Systems (MEMS) device. The principles of the present invention may, however, be applied to any environment in which a low stress, planar dielectric film is desired after the formation of topography-generating under-layers.

Figure 2B:
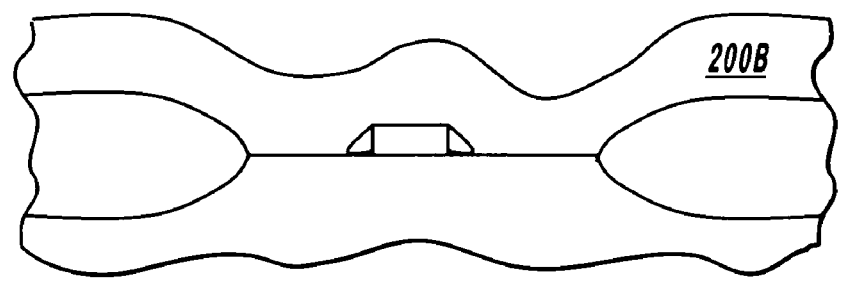

Referring to FIG. 1, the method 100 includes an act of depositing a first layer of undoped silicate glass on a micro-structure (act 101). The resulting structure is illustrated in FIG. 2B, in which an undoped silicate glass layer 200B is deposited upon the underlying micro-structure 200A of FIG. 2A. "Undoped Silicate Glass" or "USG" is a standard term of art that refers to a silicate glass that has relatively low dopant content. Dopants such as boron and phosphorous are not intentionally added to such undoped silicate glass. However, there are typically some impurities in the undoped silicate glass.

The undoped silicate glass layer 200B may be deposited using conventional processes such as, for example, Plasma Enhanced Tetra-Ethyl-Ortho-Silicate (PETEOS) in a Plasma-Enhanced Chemical Vapor Deposition (PECVD) process. In one embodiment, the first undoped silicate glass layer 200B may be deposited to a thickness of approximately one hundred nanometers. This undoped silicate glass layer 200B serves a substrate barrier to prevent dopants from migrating between the underlying micro-structure and any doped dielectric layers. The undoped silicate glass layer 200B need not be different from conventional substrate barrier layers.

In double poly silicon processes, the thickness of the undoped silicate glass layer 200B may be approximately two hundred nanometers. These are just example thicknesses. The exact thickness of any given layer described herein is not critical to the principles of the present invention. Instead, the exact layer thicknesses may be modified if applied to other applications or generations of semiconductor processing.

Figure 2C:
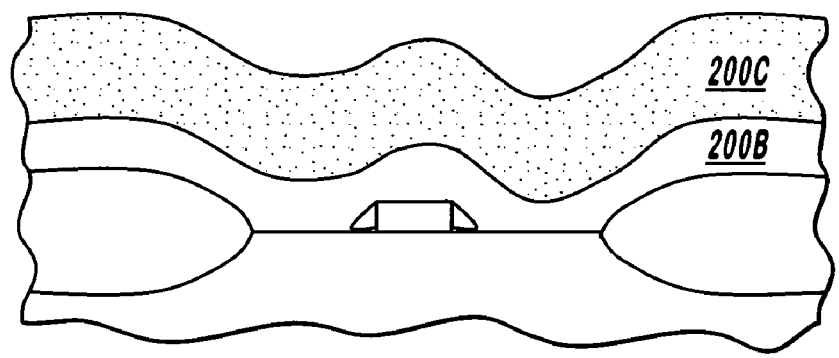

Referring to FIG. 1, a layer of phospho silicate glass is then deposited on the first layer of undoped silicate glass. One possible resulting structure is illustrated in FIG. 2C, in which the phospho silicate glass layer 200C is deposited upon the first undoped silicate glass layer 200B. The phospho-silicate glass material may be any phosphorous-doped silicate glass that has a reduced amount of boron (less than one percent by weight) or in which boron is not intentionally added. The phospho silicate glass may be deposited using a Chemical Vapor Deposition (CVD) process such as Sub-Atmospheric CVD (SACVD) or Atmospheric Pressure CVD (APCVD). This deposition technology enables thorough step coverage of irregular topography.

The phosphorous doping of the phospho silicate glass layer 200C advantageous provides contamination gettering. In other words, the phosphorous atoms trap contamination, which then is not free to diffuse into the active portions of the structure. Accordingly, the use of phosphorous reduces defects in the structure. Boron is not used to reduce the flow temperature of the phospho silicate glass. The reduction or lack of boron dopants reduces soft errors thereby improving electrical performance.

The phospho silicate glass layer 200C is then densified by applying a moderate densification temperature to the combination of the underlying micro-structure 200A, the first undoped silicate glass layer 200B, and the phospho silicate glass layer 200C (act 103). This densification temperature is sufficient to densify the phospho silicate glass layer 200C, while being below a glass flow temperature of either of the undoped silicate glass or the phospho silicate glass. A suitable temperature may be in the range of from seven hundred degrees Celsius to eight hundred degrees Celsius. The glass flow temperature, in contrast, is typically above nine hundred degrees Celsius. Due to the application of this densification temperature, the acts 101 through 103 are performed before any possible metallization process (act 106).

Figure 2D:
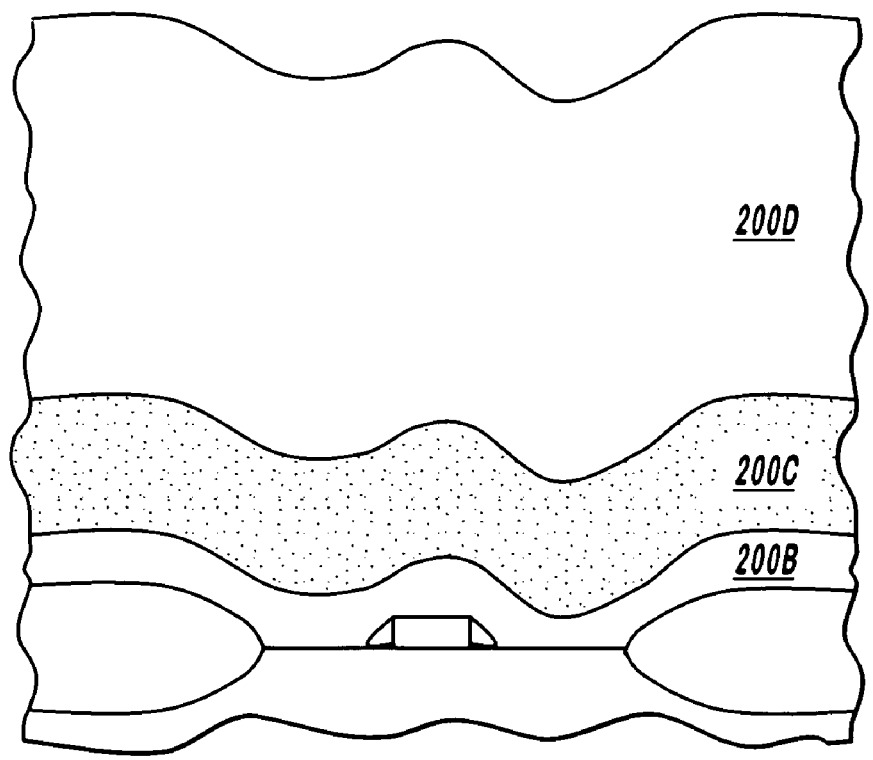

A second layer of undoped silicate glass is then deposited on the densified layer of phospho silicate glass (act 104). One possible resulting structure is illustrated in FIG. 2D, in which a second undoped silicate layer 200D is deposited on the phospho silicate glass layer 200C. Once again, this may be accomplished using PETEOS in a PECVD process. The undoped silicate glass is denser than doped silicate glass, and thus is more resistant to scratching from the Chemical Mechanical Polishing process (see act 105). This would not only minimize the probability of scratching but also simplifies the oxide CMP process since it would then be similar to the CMP process for Inter-Metal Dielectric (IMD) layers.

In one embodiment, the second undoped silicate glass layer 200D may be relatively thick as compared to the first undoped silicate glass layer 200B, and compared to the phospho silicate glass layer 200C. For example, the second undoped silicate glass layer 200D may be, approximately, one thousand nanometers thick. This thickness is large enough for CMP planarization on double poly silicon applications, allows adequate material removal for planarization, and leaves sufficient material margin to prevent reaching the phospho silicate glass layer 200C where even phospho silicate glass has shown micro-scratch susceptibility.

Figure 2E:
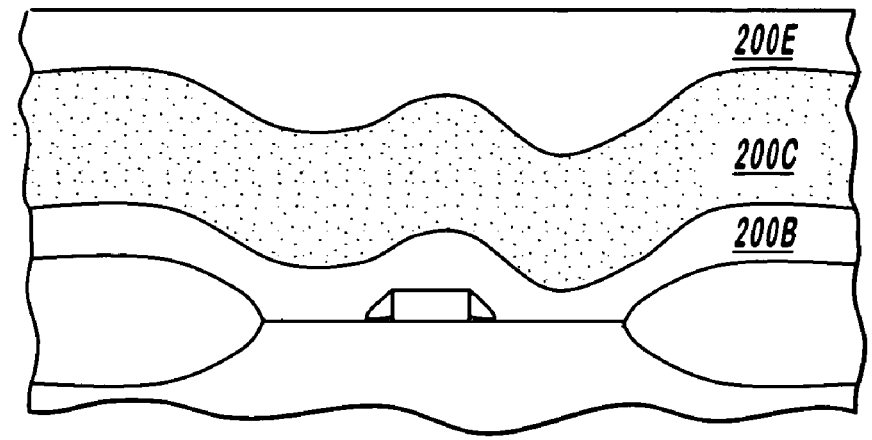
Figure 3:
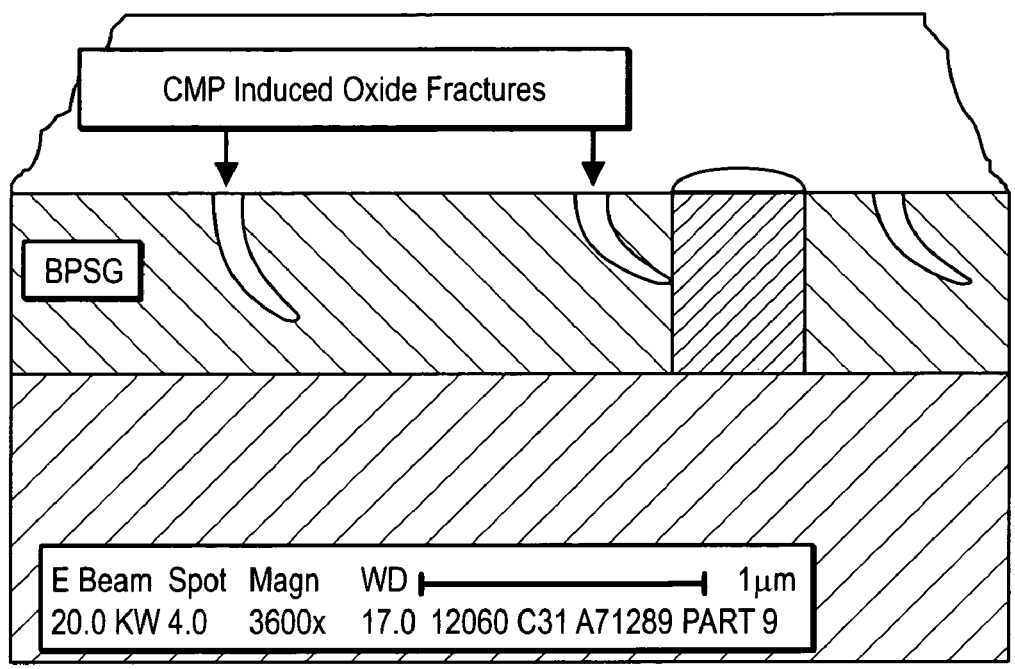
FIG. 3 illustrates a cross sectional view of fracturing caused by micro-scratches in a pre-metallization dielectric layer in accordance with the prior art.
Figure 4:
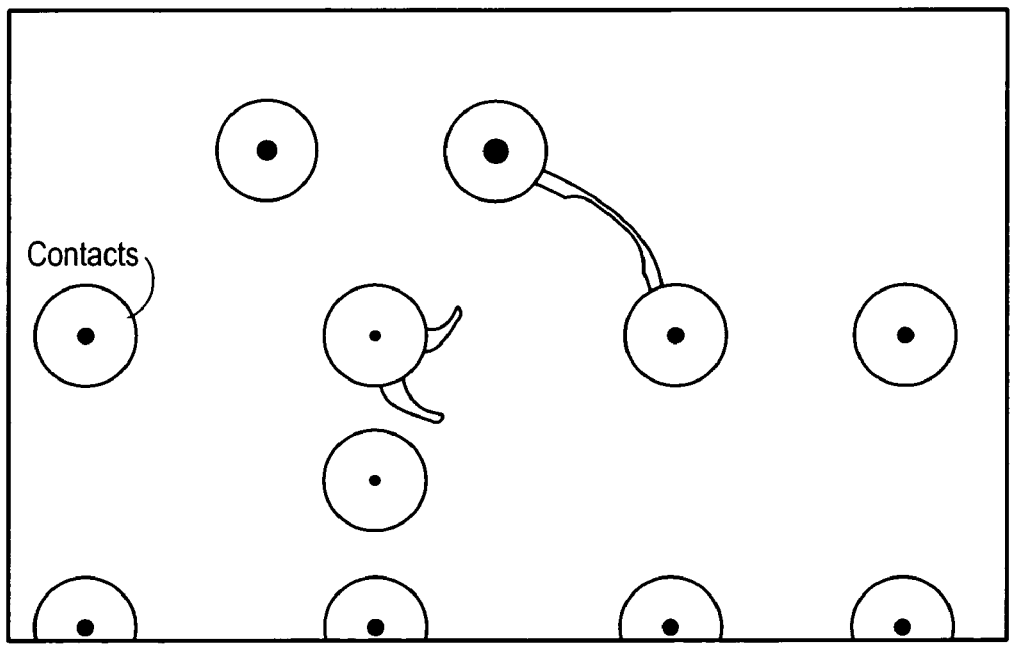
FIG. 4 illustrates a top view of a closed circuit defect caused by a micro-scratch in accordance with the prior art.

Referring back to FIG. 1, CMP polishing may then be performed on the second layer of undoped silicate glass (act 105). One possible resulting structure is illustrated in FIG. 2E, in which the wavy surface of the second undoped silicate glass layer 200D is transformed into a second undoped silicate glass layer 200E having a relatively smooth planarized top surface. Once planarization has occurred, metallization layers (not shown) may optionally be fabricated on the surface of the planarized dielectric layer represented by layers 200B, 200C, and 200E of FIG. 2E.

The resulting structure has several advantages as compared to the prior art. First, by performing densification prior to depositing the second layer of undoped silicate glass, rather than after, the internal stress of the resulting dielectric layer is significantly reduced. Significantly, elevated stress in the dielectric layer can cause an electrical shift in saturation current, breakdown voltages, and threshold voltages, thereby adversely affecting the electrical performance of underlying circuitry.

Furthermore, the resulting dielectric layer is highly dense. Undoped silicate glass is highly dense due to the lack of dopant impurities. In addition, the phospho silicate glass is also densified. The combination of low stress and high density results in a dielectric layer that is highly resistant to scratching, thereby reducing defects.

Also, the presence of phosphorous dopants in the phospho silicate glass promotes contamination gettering, thereby removing contaminants away from the electrically active portions of the micro-structure. The relative lack of boron as a dopant in this middle phospho silicate glass layer means that there are fewer soft error caused by boron decay in the dielectric layer. The result is improved electrical performance.

Lastly, the principles of the present invention use relatively well-known process technologies having high technological maturity, and does not use HDP processes, which are expensive and have lower reliability. Accordingly, defects are reduced while having a relatively low cost process.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired by United States Letters Patent is:

1. A method for forming a pre-metallization layer on an underlying micro-structure, the method comprising the following:

an act of depositing a first layer of undoped silicate glass on a micro-structure;

an act of depositing a layer of phospho silicate glass on the first layer of undoped silicate glass;

an act of densifying the layer of phospho silicate glass by applying a temperature to the combination of the layer of undoped silicate glass and the layer of phospho silicate glass that is sufficient to densify the layer of phospho-silicate glass, while being below a glass flow temperature of either of the undoped silicate glass or the phospho-silicate glass;

an act of depositing a second layer of undoped silicate glass on the densified layer of phospho silicate glass without first planarizing the densified layer of phospho silicate glass; and performing chemical mechanical polishing on the second layer of undoped silicate glass.

2. A method in accordance with claim 1, further comprising the following:

an act of depositing a metallization layer on the polished second layer of undoped silicate glass.

3. A method in accordance with claim 1, wherein the phospho-silicate glass contains less than one percent boron by weight.

4. A method in accordance with claim 1, wherein the act of depositing a first layer of undoped silicate glass on a micro-structure comprises the following:

an act of depositing the first layer of undoped silicate glass using Plasma Enhanced Tetra-Ethyl-Ortho-Silicate in a Plasma-Enhanced Chemical Vapor Deposition process.

5. A method in accordance with claim 1, wherein the act of depositing a layer of phospho silicate glass on the first layer of undoped silicate glass comprises the following:

an act of depositing the first layer of phospho silicate glass on the layer of undoped silicate glass using a Chemical Vapor Deposition process.

6. A method in accordance with claim 5, wherein the act of depositing the layer of phospho silicate glass on the first layer of undoped silicate glass using a Chemical Vapor Deposition process comprises the following:

an act of depositing the layer of phospho silicate glass using a Sub-Atmospheric Chemical Vapor Deposition process.

7. A method in accordance with claim 5, wherein the act of depositing the layer of phospho silicate glass on the first layer of undoped silicate glass using a Chemical Vapor Deposition process comprises the following:

an act of depositing the layer of phospho silicate glass using an Atmospheric Pressure Chemical Vapor Deposition process.

8. A method in accordance with claim 1, wherein the act of densifying the layer of phospho silicate glass by applying a temperature to the combination of the layer of undoped silicate glass and the layer of phospho silicate glass comprises the following:

an act of densifying the layer of phospho silicate glass by applying a temperature from seven hundred degrees Celsius to eight hundred degrees Celsius to the combination of the layer of undoped silicate glass and the layer of phospho silicate glass.

9. A method in accordance with claim 1, wherein the act of depositing a second layer of undoped silicate glass on the densified layer of phospho silicate glass comprises the following:

an act of depositing the second layer of undoped silicate glass using Plasma Enhanced Tetra-Ethyl-Ortho-Silicate in a Plasma-Enhanced Chemical Vapor Deposition process.

10. A method in accordance with claim 1, wherein a thickness of the first layer of undoped silicate glass is approximately one hundred nanometers.

11. A method in accordance with claim 10, wherein a thickness of the layer of phospho silicate glass is approximately two hundred nanometers.

12. A method in accordance with claim 11, wherein a thickness of the second layer of undoped silicate glass is approximately one thousand nanometers.

13. A method in accordance with claim 1, wherein a thickness of the second layer of undoped silicate glass is greater than a thickness of the first layer of undoped silicate glass.

14. A method in accordance with claim 13, wherein a thickness of the layer of phospho silicate glass is greater than the thickness of the first layer of undoped silicate glass.

15. A method in accordance with claim 14, wherein the thickness of the second layer of undoped silicate glass is greater than the thickness of the layer of phospho silicate glass.

16. A method in accordance with claim 14, wherein the thickness of the second layer of undoped silicate glass is greater than a thickness of the layer of phospho silicate glass.

17. A method in accordance with claim 1, wherein the micro-structure comprises a portion of a semiconductor circuit.

18. A method in accordance with claim 1, wherein the micro-structure comprises a portion of a Micro-Electro-Mechanical Systems device.

19. A micro-structure comprising:

an underlying pre-metallization micro-structure; and an overlying structure overlying the underlying pre-metallization micro-structure, the overlying structure being formed by application of the following:

an act of depositing a first layer of undoped silicate glass on a micro-structure;

an act of depositing a layer of phospho silicate glass on the first layer of undoped silicate glass;

an act of densifying the layer of phospho silicate glass by applying a temperature to the combination of the layer of undoped silicate glass and the layer of phospho silicate glass that is sufficient to densify the layer of phospho-silicate glass, while being below a glass flow temperature of either of the undoped silicate glass or the phospho-silicate glass;

an act of depositing a second layer of undoped silicate glass on the densified layer of phospho silicate glass without first planarizing the densified layer of phospho silicate glass; and an act of performing chemical mechanical polishing on the second layer of undoped silicate glass.

20. A micro-structure in accordance with claim 19, further comprising the following:

an act of depositing a metallization layer on the polished second layer of undoped silicate glass.

21. A micro-structure in accordance with claim 19, wherein the phospho silicate glass contains less than one percent boron by weight.

22. A micro-structure in accordance with claim 19, wherein the act of depositing a first layer of undoped silicate glass on a micro-structure comprises the following:
an act of depositing the first layer of undoped silicate glass using Plasma Enhanced Tetra-Ethyl-Ortho-Silicate in a Plasma-Enhanced Chemical Vapor Deposition process.

23. A micro-structure in accordance with claim 19, wherein the act of depositing a layer of phospho silicate glass on the first layer of undoped silicate glass comprises the following:
an act of depositing the first layer of phospho silicate glass on the layer of undoped silicate glass using a Chemical Vapor Deposition process.

24. A micro-structure in accordance with claim 23, wherein the act of depositing the layer of phospho silicate glass on the first layer of undoped silicate glass using a Chemical Vapor Deposition process comprises the following:
an act of depositing the layer of phospho silicate glass using a Sub-Atmospheric Chemical Vapor Deposition process.

25. A micro-structure in accordance with claim 23, wherein the act of depositing the layer of phospho silicate glass on the first layer of undoped silicate glass using a Chemical Vapor Deposition process comprises the following:
an act of depositing the layer of phospho silicate glass using an Atmospheric Pressure Chemical Vapor Deposition process.

26. A micro-structure in accordance with claim 19, wherein the act of densifying the layer of phospho silicate glass by applying a temperature to the combination of the layer of undoped silicate glass and the layer of phospho silicate glass comprises the following:
an act of densifying the layer of phospho silicate glass by applying a temperature from seven hundred degrees Celsius to eight hundred degrees Celsius to the combination of the layer of undoped silicate glass and the layer of phospho silicate glass.

27. A micro-structure in accordance with claim 19, wherein the act of depositing a second layer of undoped silicate glass on the densified layer of phospho silicate glass comprises the following:
an act of depositing the second layer of undoped silicate glass using Plasma Enhanced Tetra-Ethyl-Ortho-Silicate in a Plasma-Enhanced Chemical Vapor Deposition process.

28. A micro-structure in accordance with claim 19, wherein a thickness of the first layer of undoped silicate glass is approximately one hundred nanometers.

29. A micro-structure in accordance with claim 28, wherein a thickness of the layer of phospho silicate glass is approximately two hundred nanometers.

30. A micro-structure in accordance with claim 29, wherein a thickness of the second layer of undoped silicate glass is approximately one thousand nanometers.

31. A micro-structure in accordance with claim 19, wherein a thickness of the second layer of undoped silicate glass is greater than a thickness of the first layer of undoped silicate glass.

32. A micro-structure in accordance with claim 31, wherein a thickness of the layer of phospho silicate glass is greater than the thickness of the first layer of undoped silicate glass.

33. A micro-structure in accordance with claim 32, wherein the thickness of the second layer of undoped silicate glass is greater than the thickness of the layer of phospho silicate glass.

34. A micro-structure in accordance with claim 32, wherein the thickness of the second layer of undoped silicate glass is greater than a thickness of the layer of phospho silicate glass.

35. A micro-structure in accordance with claim 19, wherein the micro-structure comprises a portion of a semiconductor circuit.

36. A micro-structure in accordance with claim 19, wherein the micro-structure comprises a portion of a Micro-Electro-Mechanical Systems device.

* * * * *